United States Patent
Carpenter et al.

(10) Patent No.: US 6,798,954 B2
(45) Date of Patent: Sep. 28, 2004

(54) PACKAGED OPTICAL MICRO-MECHANICAL DEVICE

(75) Inventors: Barry S. Carpenter, Oakdale, MN (US); Kathy L. Hagen, Stillwater, MN (US); Robert G. Smith, Vadnais Heights, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 33 days.

(21) Appl. No.: 09/911,950

(22) Filed: Jul. 24, 2001

(65) Prior Publication Data

US 2003/0021551 A1 Jan. 30, 2003

(51) Int. Cl.[7] .................................................. G02B 6/35
(52) U.S. Cl. .............................. 385/52; 385/16; 385/18; 385/19
(58) Field of Search ............................. 385/16–23, 140; 359/223–226, 290, 291

(56) References Cited

U.S. PATENT DOCUMENTS

| | | | |
|---|---|---|---|
| 4,119,363 A | 10/1978 | Camlibel et al. | |
| 4,186,995 A | 2/1980 | Schumacher | |
| 4,346,294 A | 8/1982 | Albaugh et al. | |
| 4,347,655 A | 9/1982 | Zory et al. | |
| 4,399,453 A | 8/1983 | Berg et al. | |
| 4,399,541 A | 8/1983 | Kovats et al. | |
| 4,413,881 A | 11/1983 | Kovats | |
| 4,438,338 A | 3/1984 | Stitt et al. | |
| 4,567,598 A | 1/1986 | Noguchi et al. | |

(List continued on next page.)

FOREIGN PATENT DOCUMENTS

| | | |
|---|---|---|
| EP | 0 010 352 | 4/1980 |
| EP | 0 414 338 A2 | 2/1991 |
| EP | 0 548 440 A1 | 6/1993 |
| EP | 0 465 230 B1 | 5/1995 |
| EP | 0 762 161 A1 | 3/1997 |
| EP | 0 852 337 A1 | 7/1998 |
| EP | 0 853 396 A2 | 7/1998 |
| EP | 0 637 765 B1 | 12/1998 |
| EP | 0 886 144 A1 | 12/1998 |
| EP | 0 961 150 A2 | 12/1999 |
| EP | 0 982 610 A2 | 3/2000 |
| EP | 1 057 779 A2 | 12/2000 |
| EP | 1108677 A1 | 6/2001 |
| JP | 2001-296486 | 10/2001 |
| WO | 00/07225 | 2/2000 |
| WO | 00/25160 | 5/2000 |
| WO | 01/04963 | 1/2001 |
| WO | WO 02/37161 A2 | 5/2002 |

OTHER PUBLICATIONS

"Free–Space Fiber–Optic Switches Based on MEMS Vertical Torsion Mirrors", Lee et al., Journal of Lightware Technology, vol. 17, No. 1, Jan. 1999.*

"MEMS Packaging for Micro Mirror Switches", Huang et al., Electronic Components and Technology Conference, 1998.*

See p. 4 section entitled "Other Prior Art—Non Patent Literature Documents".

(List continued on next page.)

*Primary Examiner*—Hemang Sanghavi
*Assistant Examiner*—Scott A Knauss
(74) *Attorney, Agent, or Firm*—Bradford B. Wright

(57) ABSTRACT

A packaged optical micro-mechanical device. A die includes one or more optical micro-mechanical devices on a first surface of a substrate. The first surface includes a die reference surface. A package frame includes an aperture and a package frame reference surface proximate the aperture adapted to receive the die reference surface such that the optical micro-mechanical devices are located in the aperture. One or more V-grooves are positioned relative to an optical interface reference plane adjacent to the micro-mechanical devices and terminating adjacent to the aperture. One or more optical fibers are located in the V-grooves optically coupled with one or more of the optical micro-mechanical devices.

36 Claims, 6 Drawing Sheets

U.S. PATENT DOCUMENTS

| | | | | |
|---|---|---|---|---|
| 4,932,745 | A | * | 6/1990 | Blonder ........................ 385/16 |
| 5,050,953 | A | | 9/1991 | Anderson et al. |
| 5,113,404 | A | | 5/1992 | Gaebe et al. |
| 5,208,880 | A | * | 5/1993 | Riza et al. ..................... 385/18 |
| 5,333,225 | A | | 7/1994 | Jacobowitz et al. |
| 5,555,330 | A | | 9/1996 | Pan et al. |
| 5,761,350 | A | | 6/1998 | Koh |
| 5,774,604 | A | | 6/1998 | McDonald |
| 5,872,880 | A | | 2/1999 | Maynard |
| 5,889,904 | A | | 3/1999 | Pan et al. |
| 5,923,995 | A | | 7/1999 | Kao et al. |
| 5,943,158 | A | | 8/1999 | Ford et al. |
| 5,963,695 | A | | 10/1999 | Joyce |
| 5,991,483 | A | | 11/1999 | Engelberth |
| 5,993,075 | A | | 11/1999 | Huang et al. |
| 5,993,931 | A | | 11/1999 | Grencavich |
| 5,999,671 | A | | 12/1999 | Jin et al. |
| 5,999,674 | A | | 12/1999 | Yui et al. |
| 6,007,208 | A | | 12/1999 | Dickensheets et al. |
| 6,021,243 | A | | 2/2000 | Fasanella et al. |
| 6,140,144 | A | | 10/2000 | Najafi et al. |
| 6,146,917 | A | | 11/2000 | Zhang et al. |
| 6,154,305 | A | * | 11/2000 | Dickensheets et al. ...... 359/225 |
| 6,164,837 | A | | 12/2000 | Haake et al. |
| 6,185,107 | B1 | | 2/2001 | Wen |
| 6,188,814 | B1 | | 2/2001 | Bhalla |
| 6,470,111 | B2 | | 10/2002 | Mortenson et al. |
| 2001/0004085 | A1 | | 6/2001 | Gueissaz |
| 2002/0097951 | A1 | * | 7/2002 | Mortenson et al. ........... 385/18 |
| 2002/0131680 | A1 | | 9/2002 | Wilson et al. |
| 2002/0164113 | A1 | | 11/2002 | Rensing et al. |
| 2002/0164123 | A1 | | 11/2002 | Hamerly et al. |
| 2002/0181838 | A1 | | 12/2002 | Cunningham et al. |
| 2003/0021541 | A1 | | 1/2003 | Carpenter |
| 2003/0021570 | A1 | | 1/2003 | Carpenter |

OTHER PUBLICATIONS

Harsh et al., "Flip–Chip Assembly for SI–Based RF MEMS", IEEE Conference on Micromechanical Systems, pp. 273–278 (1999).

Lin et al., "Lightwave Micromachines for Optical Crossconnects".

Lin et al., "High–Density Micromachined Polygon Optical Crossconnects Exploiting Network Connection–Symmetry", 10 IEEE Photonics Technology Letters 1425–1427 (1998).

Fouquet et al., "Compact Scalable Fiber Optic Cross–Connect Switches", IEEE WDM Components Conference, pp. 59–60 (1999).

W. Ko., "Packaging of Microfabricated Devices and Systems", 42 Materials Chemistry and Physics 169–175 (1995).

Goldstein et al., "Optical–Mems–Based Tail–End Switching for Restoration of Line–Rate Services", AT&T Labs–Research.

Butler et al., "An Embedded Overly Concept for Microsystems Packaging", 23 IEEE Transactions on Advanced Packaging 617–622 (2000).

Tilmans et al., "The Indent Reflow Sealing (IRS) Technique—A Method for the Fabrication of Sealed Cavities for MEMS Devices", 9 Journal of Microelectromechanical Systems 206–216 (2000).

Koh et al., "Optoelectronic Multichip Modules for High–Speed Computer Systems and Communication Networks", 36 Opt. Eng. 1319–1325 (1997).

Baliga, John, "Low–Cost MEMS Packing with Cavities", 9 Journal of Microelectromechanical Systems 206 (2000).

Ramesham et al., "Challenges in Interconnection and Packaging of Microelectromechanical Systems", IEEE Electronic Components and Technology Conference (2000).

Comtois et al., "Applications for Surface–Micromachined Polysilicon Thermal Actuators and Arrays", 58 Sensors and Actuators 19–25 (1997).

Mohr et al., "Microoptical devices based on free space optics with LIGA microoptical benches examples & perspectives", Proceedings of the SPIE, SPIE, Bellingham, VA, US, vol. 2783, Jun. 12, 1996, pp. 48–54.

Toshiyoshi et al., "Electrostatic Micro Torsion Mirrors for an Optical Switch Matrix", Journal of Microelectromechanical Systems, IEEE Inc., New York, US, vol. 5, No. 4, Dec. 1, 1996, pp. 231–237.

* cited by examiner

PACKAGED OPTICAL MICRO-MECHANICAL DEVICE

FIELD OF THE INVENTION

The present invention relates to a packaged micro-mechanical devices with an optical interface, and in particular, to an optical interface reference plane adjacent to the optical micro-mechanical device that is useful for aligning optical fibers.

BACKGROUND OF THE INVENTION

Fabricating complex micro-electro-mechanical systems (MEMS) and micro-optical-electro-mechanical systems (MOEMS) devices represents a significant advance in micro-mechanical device technology. Presently, micrometer-sized analogs of many macro-scale devices have been made, such as for example hinges, shutters, lenses, mirrors, switches, polarizing devices, and actuators. These devices can be fabricated, for example, using Multi-user MEMS Processing (MUMPs) available from Cronos Integrated Microsystems located at Research Triangle Park, North Carolina.

One method of forming a MEMS or MOEMS device involves patterning the device in appropriate locations on a substrate. As patterned, the device lies flat on top of the substrate. For example, the hinge plates of a hinge structure or a reflector device are both formed generally coplanar with the surface of the substrate using the MUMPs process. Applications of MEMS and MOEMS devices include, for example, data storage devices, laser scanners, printer heads, magnetic heads, micro-spectrometers, accelerometers, scanning-probe microscopes, near-field optical microscopes, optical scanners, optical modulators, micro-lenses, optical switches, and micro-robotics.

Packaging MEMS devices presents unique problems due to the physically active nature of the microstructures. To maintain a stable environment and to keep out dust particles, corrosive and/or potentially fouling vapors, etc., the micro-machined structures must be enclosed within a sealed package. A sealed package also minimizes the risk of physical damage during handling or operation. Traditional integrated circuit encapsulation methods such as epoxy resin potting and thermoplastic injection molding, while useful with integrated circuits, which have no moving parts, are incapable of use directly with micro-machined structures. The encapsulant must not contact the active portions of the micro-machined structure. Moreover, common encapsulation techniques such as injection molding, often requiring pressures of 1000 psi, would easily crush the microstructure.

One application for micro-machined structures is in connection with processing optical signals, such as optical switches, wavelength specific equalizers, polarization mode dispersion compensators, and the like. These applications, however, require coupling optical fibers with the packaged micro-machined structures. Various techniques are known for packaging MEMS devices, such as disclosed in U.S. Pat. No. 6,146,917 (Zhang et al.) EP0852337; and EP1057779. None of these packaging techniques, however, teach coupling optical fibers to the MEMS device.

BRIEF SUMMARY OF THE INVENTION

The present invention is directed to a packaged optical micro-mechanical device with an optical interface reference plane adjacent to the micro-mechanical devices. One or more optical micro-mechanical devices are located on a first surface of a die. The first surface includes a die reference surface. A package frame comprising an aperture and a package frame reference surface proximate the aperture is adapted to receive the die reference surface such that the optical micro-mechanical devices are located in the aperture. One or more optical interconnect alignment mechanisms, such as V-grooves, terminate adjacent to the aperture and are positioned relative to an optical interface reference plane. Distal ends of one or more optical interconnects, such as optical fibers are located in optical interconnect alignment mechanisms and are optically coupled with one or more of the optical micro-mechanical devices.

The optical interface reference plane can be the die reference surface, the package frame reference surface or a plane parallel to the die reference surface located between the die reference surface and the package frame reference surface. Locating the optical interface reference plane near to the plane containing the optical interconnects improves alignment and minimizes tolerance build-up.

The optical interconnect alignment mechanisms can be located in the package frame reference surface, in the die reference surface or in both the package frame reference surface and the die reference surface. The optical interconnects can have tangential relationship with the optical interface reference plane. In another embodiment, a first portion of the optical interconnect is positioned on one side of the optical interface reference plane and a second portion of the optical interconnect is positioned on another side of the optical interface reference plane.

In one embodiment, the optical interconnect contacts the die. In another embodiment, the optical interconnect terminate adjacent to the die without contacting the die. In another embodiment, lenses located in the V-groove are optically coupled to the distal end of the optical fiber. The lenses optically couple the optical fiber with one or more optical micro-mechanical devices. The lens can contact the die or can terminate adjacent to the die without contacting the die.

One or more contact pads can optionally be interposed between the die reference surface and the package frame reference surface. The contact pads can be located on the die reference surface and/or the package frame reference surface. In one embodiment, the contact pads electrically couple one or more optical micro-mechanical devices with external electrical contacts, such as contact pads located on the package frame reference surface. In another embodiment, the contact pads electrically couple one or more optical micro-mechanical devices with a flexible circuit member. The contact pads can also be used to mechanical attach the die to the package frame.

The aperture can be a rectangular shape or a complex shape. In one embodiment, the aperture comprises a cross-shape configured so that the distal ends of the optical fibers terminate in arms of the cross-shaped aperture without contacting the die.

A tooling fixture can be located on a rear surface of the die. The tooling fixture can be a tooling post and/or a heat sink. An encapsulating material is typically used to seal the die to the package frame. A cover seals the die to the package frame.

A flexible circuit can be electrically coupled to the die. In one embodiment, the flexible circuit extends across a rear surface of the die and one or more vias extend through the die and electrically coupling the optical micro-mechanical devices to the flexible circuit. In another embodiment, a shoulder region is formed adjacent to the optical micromechanical devices. Electrical traces extend from the optical micro-mechanical devices to the shoulder region. A flexible circuit is located between the shoulder region and the optical interface reference plane. The flexible circuit is electrically coupled to the traces.

In one embodiment, the package frame comprises one or more alignment posts position to engage with the die reference surface. A cavity is preferably formed adjacent to the alignment posts on a side opposite the aperture. A flexible circuit extending through the cavity electrically couples with contact pads on the die reference surface. An adhesive located in the cavity can be used to retain the die to the alignment posts.

The present invention is also directed to an optical communication system including at least one packaged optical micro-mechanical device in accordance with the present invention.

BRIEF DESCRIPTION OF THE SEVERAL VIEWS OF THE DRAWING

Further features of the invention will become more apparent from the following detailed description of specific embodiments thereof when read in conjunction with the accompany drawings.

DETAILED DESCRIPTION OF THE INVENTION

Various technologies for fabricating micro-mechanical devices are available, such as for example the Multi-User MEMS Processes (MUMPs) from Cronos Integrated Microsystems located at Research Triangle Park, North Carolina. One description of the assembly procedure is described in "MUMPs Design Handbook," revision 6.0 (2001) available from Cronos Integrated Microsystems. As used herein, "micro-mechanical device" refers to micrometer-sized mechanical, opto-mechanical, electromechanical, or opto-electro-mechanical device constructed on the surface of a substrate.

Polysilicon surface micromachining adapts planar fabrication process steps known to the integrated circuit (IC) industry to manufacture micro-electro-mechanical or micro-mechanical devices. The standard building-block processes for polysilicon surface micromachining are deposition and photolithographic patterning of alternate layers of low-stress polycrystalline silicon (also referred to a polysilicon) and a sacrificial material (e.g., silicon dioxide or a silicate glass). Vias etched through the sacrificial layers at predetermined locations provide anchor points to a substrate and mechanical and electrical interconnections between the polysilicon layers. Functional elements of the device are built up layer by layer using a series of deposition and patterning process steps. After the device structure is completed, it can be released for movement by removing the sacrificial material using a selective etchant such as hydrofluoric acid (HF) which does not substantially attack the polysilicon layers (referred to herein as "release"). Where a single substrate contains multiple micro-electro-mechanical or micro-mechanical devices, the substrate or wafer is typically cut into discrete pieces before release.

The result is a construction system generally including a first layer of polysilicon which provides electrical interconnections and/or a voltage reference plane, and additional layers of mechanical polysilicon which can be used to form functional elements ranging from simple cantilevered beams to optical micro-mechanical devices. As used herein, "optical micro-mechanical device" refers to a micro-mechanical device for manipulating optical signals, including without limitation optical switches, near-field optical microscopes, optical scanners, optical modulators, micro-lenses, wavelength specific equalizers, polarization mode dispersion compensators, and the like. Examples of optical micro-mechanical devices are shown in U.S. Patent Applications entitled Optical Switch Based On Rotating Vertical Micro-Mirror filed Jan. 29, 2001, Ser. No. 09/771,757; MEMS-Based Polarization Mode Dispersion Compensator filed Jan. 29, 2001, Ser. No. 09/771,765; and MEMS-Based Wavelength Equalizer filed Oct. 31, 2000, Ser. No. 09/702,591.

Figure 1:
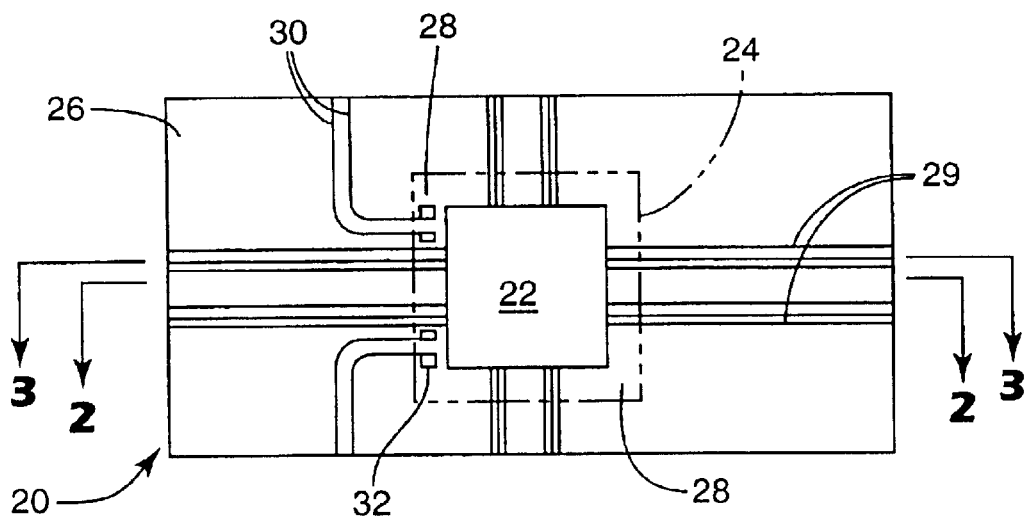
FIG. 1 is a top view of a package frame in accordance with the present invention.

FIG. 1 is a top view of a package frame 20 for packaging optical micro-mechanical devices in accordance with the present invention. The package frame 20 includes an aperture 22 for receiving a die 24 containing one or more optical micro-mechanical devices in a flip-chip configuration. The aperture 22 can be virtually any shape. Flip-chip bonding involves bonding the die 24 face down on package frame reference surface 28. Die 24 is shown in phantom to indicate the interface of the package frame 20 with the die 24. As used herein, "die" refers to a substrate containing one or more optical micro-mechanical devices.

In one embodiment, top surface 26 of the package frame 20 includes a plurality of traces 30 electrically coupled to contact pads 32 that terminate in the package frame reference surface 28. In embodiments where the entire top surface 26 is planarized, the package frame reference surface 28 may be the entire top surface 26. The contact pads 32 electrically couple with corresponding contact pads on the die 24. The present flip-chip configuration allows placement of contact pads over the top surface of the die 24, resulting in a significant increase in density and input/output connections. In the embodiment of FIG. 1, the top surface 26 includes a series of optical interconnect alignment mechanisms 29, such as a V-groove, adapted to align an optical interconnect, such as an optical fiber, with aperture 22 and the die 24. The optical fiber can be bare optical fiber, an optical fiber with lens attached (such as GRIN lens), an optical fiber surrounded by ferrules with or without a lens, or a combination thereof.

The package frame 20 can be constructed of a variety of materials, including ceramics, metals and plastics. The ease of shaping along with reliability and attractive material properties such as electrical insulation and hermetic sealing, have made ceramics a mainstay in electronic packaging. Ceramics are widely used in multi-chip modules and advanced electronic packages such as ball grid arrays. Ceramics provide a combination of electrical, thermal and mechanical properties desirable for packaging micro-mechanical devices. The coefficient of thermal expansion (CTE) for ceramic packaging can be designed to closely match the CTE of the die containing the micro-mechanical devices.

Metal packages are practical because they are robust and easy to produce and assemble. Metal packages are attractive for optical micro-mechanical device packaging for the same reason they were adopted by the integrated circuit industry. Metal packages satisfy the pin count requirement of most optical micro-mechanical device applications and they can be prototyped on small volumes with a short turn-around time. Metal packaging also provides a hermetic seal.

Molded plastic packages are typically not hermetic like metal or ceramic. Plastic packages are attractive because of the relatively low cost and ease of manufacturing.

Figure 2:
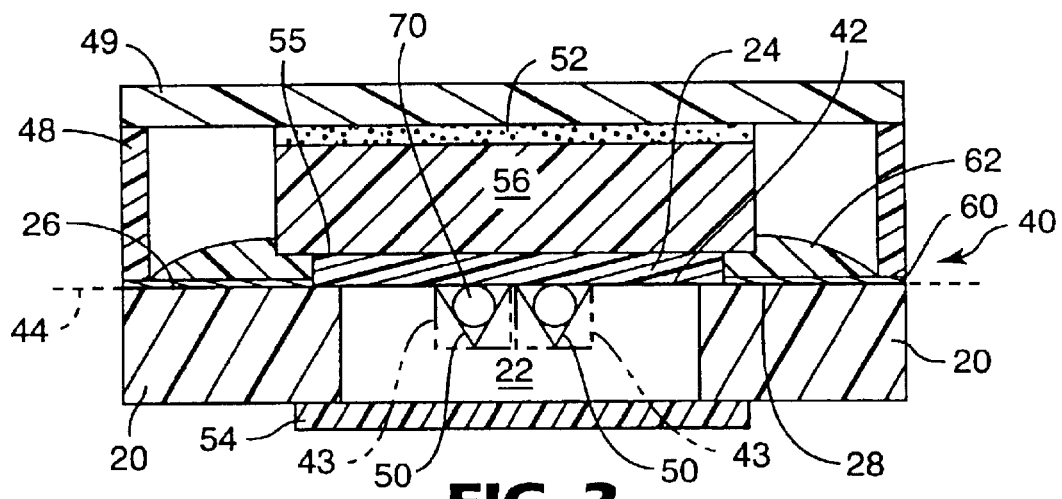
FIG. 2 is a side sectional view of a packaged micro-mechanical device using the package frame of FIG. 1 in accordance with the present invention.
Figure 3:
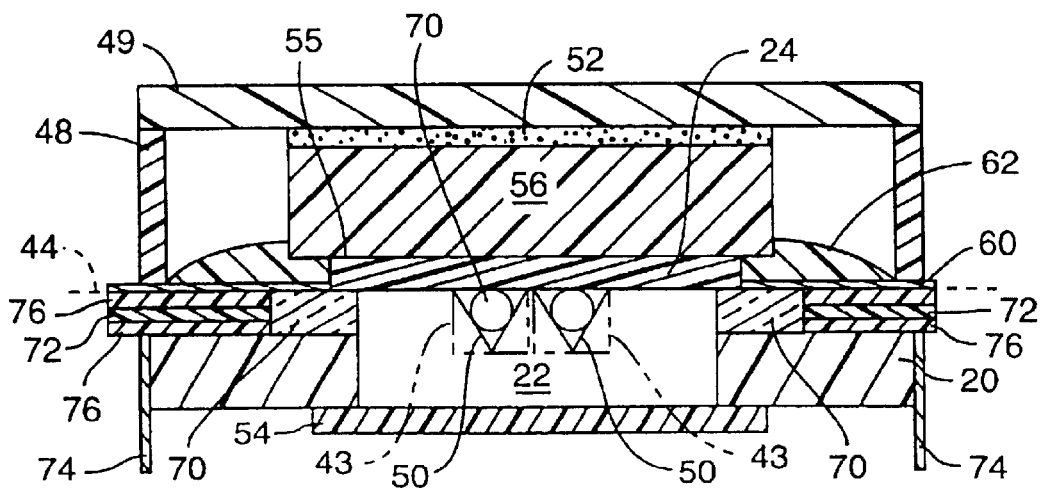
FIG. 3 is a side sectional view of the packaged micro-mechanical device of FIG. 2 taken at a different location.

FIGS. 2 and 3 are side sectional views of a packaged optical micro-mechanical device 40 using the package frame 20 shown in FIG. 1. Die reference surface 42 on the die 24 is bonded to package frame reference surface 28 on the package frame 20. In the embodiment of FIG. 2, the interface of the die reference surface 42 and package frame reference surface 28 comprises an optical interface reference plane 44 that is used to align ferrules 76 containing optical fibers 72 and associated lenses 70 with optical micro-mechanical devices 43 (see FIG. 3). The optical micro-mechanical devices 43 are illustrated in phantom so as to not obscure the lenses 70. Only some of the optical micro-mechanical devices 43 are shown so that the lenses 70 and other features are visible. As used herein, "die reference surface" refers to the top surface of a die upon which the optical micro-mechanical devices are constructed. The "optical interface reference plane" refers to a reference plane adjacent to the micro-mechanical devices, such as the die reference surface, the package frame reference surface, or some reference plane located therebetween. By locating the optical interface reference plane adjacent to the optical micro-mechanical devices 43, tolerance build-up is minimized.

In the embodiment illustrated in FIGS. 2 and 3, V-grooves 50 are formed in top surface 26 of the package frame 20. The depth of the V-grooves 50 are accurately formed to provide the vertical alignment of the fibers 72, ferrules 76 and lenses 70 with the micro-mechanical devices 43. In one embodiment, the V-grooves allow the lenses 70 to form a tangential relationship with the optical interface reference plane 44. In the illustrated embodiment, groups of lenses 70 are arranged perpendicular to each other, but still tangential to the optical interface reference plane 44. V-Grooves can be formed using mechanical or chemical material removal techniques, such as etching.

The die 24 and the V-grooves 50 capture and accurately align the lenses 70 of the ferrules 76 with the optical interface reference plane 44 and the optical micro-mechanical devices 43. The embodiment of FIGS. 2 and 3 is particularly well suited when the active optical surfaces on the optical micro-mechanical devices 43 extend above the die reference surface 42 an amount generally corresponding to half the diameter of the lenses 70. In that configuration, the lenses 70 are centered with respect to the micro-mechanical devices 43.

In one embodiment of the present packaged optical micro-mechanical device 40, electrical interconnects are provided by flex circuit 60. The flex circuit 60 electrically connects the die 24 to the package frame 20. In another embodiment, the flex circuit 60 extends along the top surface 26 to the edge of the package frame 20. Various techniques can be used to electrically couple the flex circuit 60 with the die 24, such as solder reflow, conductive adhesives, tape automated bonding, thermo-compression, and the like.

In the illustrated embodiment, external electrical contacts 74 are optionally provided around the perimeter of the package frame 20 to electrically couple the flex circuit 60 and the optical micro-mechanical devices 43 to a printed circuit board or other electrical device. A wide variety of electric contact configurations can be used to deliver electric current to the die 24, such as a ball grid array (BGA), land grid array (LGA), plastic leaded chip carrier (PLCC), pin grid array (PGA), edge card, small outline integrated circuit (SOIC), dual in-line package (DIP), quad flat package (QFP), leadless chip carrier (LCC), chip scale package (CSP).

Rear surface 55 of the die 24 includes a tooling fixture 56, such as a heat sink and/or a tooling post. In the embodiment of FIGS. 2 and 3, the functions of the heat sink and the tooling post are combined in single structure. The tooling fixture 56 can be formed from a single piece of material or separate components. In one embodiment, the rear surface 55 is attached to the tooling fixture 56 prior to the individual die 24 being cut from the wafer. The tooling fixture 56 are preferably attached prior to the optical micro-mechanical devices 43 being released from the die 24. The tooling fixture 56 can be attached to the die 24 using a variety of adhesives.

The tooling fixture 56 provide convenient handles for users and automated fabrication equipment to handle the die 24 without damage to the optical micro-mechanical devices 43. Once the tooling fixture 56 is attached, the front surface or die reference surface 42 are unobstructed and available for HF etching and engagement with the package frame 20. Once attached to the package frame 20, the tooling fixture 56 becomes an integral part of the packaged optical micro-mechanical device 40.

Upper frame member 48 and cover 49 seal the die to the package frame 20. The upper frame member 48 and cover 49 can be formed as a single component or multiple components. The tooling fixture 56 facilitates handling of the die 24 during the packaging process. Compliant thermally conductive material 52 is preferably located between the tooling fixture 56 and the cover 49 to conduct heat away from the packaged optical micro-mechanical device 40. An encapsulating material 62 can optionally be placed over the die 24 and/or the tooling fixture 56 to further seal the aperture 22 from environmental contamination. Bottom cover 54 seals the aperture 22 opposite the die 24. Aperture 22 is optionally a vacuum or can be filled with a gas, such as nitrogen or argon.

True hermetic sealed packages are assumed to be made of metal or non-organic materials. For some applications of the packaged optical micro-mechanical device 40, a hermetic seal is not required. For example, an overall enclosure may provide the required protection for the packaged optical micro-mechanical device 40. In these embodiments, only the encapsulating material 62 is used and the upper frame member 48 and cover 49 are omitted. The encapsulating material 62 is preferably a low out-gassing on cure elastomer that minimizes condensation on the optical micro-mechanical devices 43, such as epoxy, epoxy with silica fibers, epoxy cresol novolac polymer.

Figure 4:
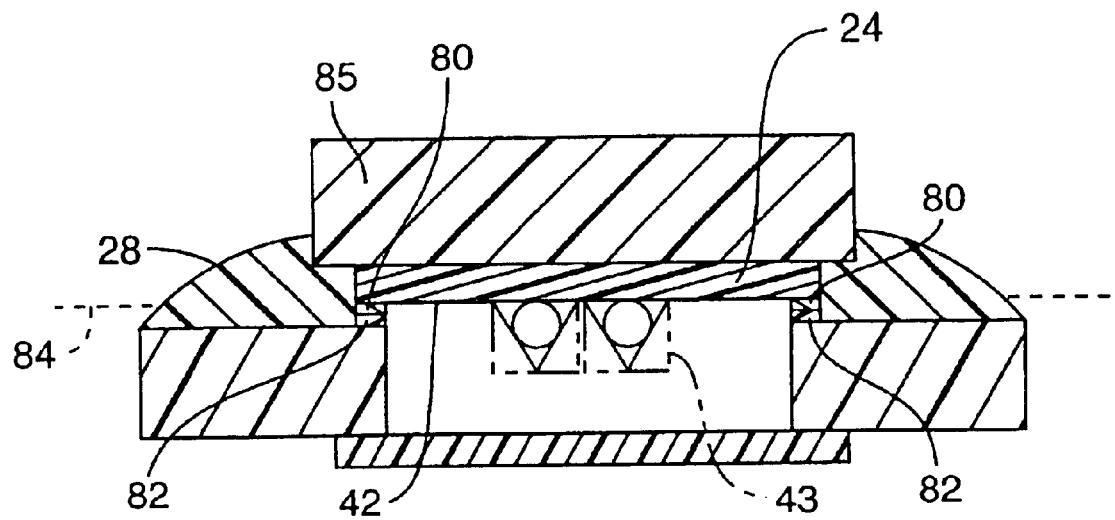
FIG. 4 is a side sectional view of a packaged micro-mechanical device having mounting or contact pads in accordance with the present invention.

The embodiments of FIGS. 2 and 3 illustrate the die 24 bonded directly to the package frame reference surface 28. FIG. 4 illustrates an alternate embodiment in which the die reference surface 42 on the die 24 and/or the package frame reference surface 28 include one or more contact pads 80, 82. The contact pads 80, 82 can be simply used to accurately align and mount the die 24 to the package frame reference surface 28. In another embodiment, the contact pads 80, 82 provide an electrical interconnection between the optical micro-mechanical devices 43 on the die reference surface 42 and the contact pads 32 (see FIG. 1) on the package frame 20. The contact pads 80, 82 can be constructed from solder, conductive adhesive or a variety of other conductive materials. As used herein, "contact pads" refers to a mechanical and/or electrical interface between a die and a package frame.

Although the embodiment of FIG. 4 shows two contact pads 80, 82, a single bonding pad may be located on either the die reference surface 42 or the package frame reference surface 28. In the embodiment of FIG. 4, optical interface reference plane 84 is preferably coplanar with the die reference surface 42. In another embodiment, the optical interface reference plane 84 can be located anywhere between the die reference surface 42 and the package frame reference surface 28. For example, the optical interface reference plane can be located at the interface between the contact pads 80 and 82. The optical interface reference plane 84 is preferably adjacent to the optical micro-mechanical devices 43. In the embodiment of FIG. 4, the functions of the heat sink and the tooling post are combined in single structure 85. Although FIG. 4 illustrates the tooling fixture 85 as a rectangular block, the shape can vary depending upon the application, the nature of the package frame, the type of optical micro-mechanical devices, the type of cover used, and other factors.

Figure 5:
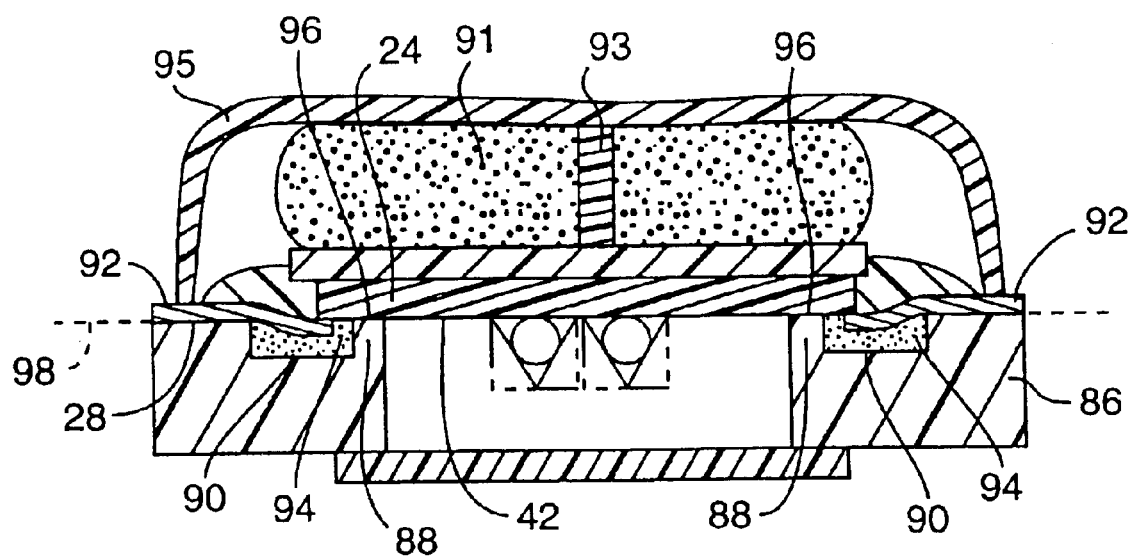
FIG. 5 is a side sectional view of a packaged micro-mechanical device having alignment posts in accordance with the present invention.

FIG. 5 illustrates an alternate package frame 86 with one or more bonding and alignment posts 88 and an adjacent cavity 90. In one embodiment, the cavity 90 is used to electrically couple flex circuit 92 to contact pads on die reference surface 42. In the embodiment of FIG. 5, the die reference surface 42 and the package frame reference surfaces 28 are coplanar and preferably comprise an optical interface reference plane 98. In another embodiment, the cavity 90 can be filled with an adhesive 94 used to retain the die 24 to the alignment posts 88. Locating the adhesive 94 in the cavity 90 permits direct physical contact between the die reference surface 42 and tops 96 of the alignment posts 88, thereby minimizing misalignment.

In the embodiment of FIG. 5, a compliant thermally conductive material 91 optionally surrounds tooling post 93. The material 91 can operate as a heat sink and/or to buffer the die 24 from shock loads. Tooling post 93 optionally contacts or engages with inside surface of cover 95 to further secure the die 24 to the package frame 86.

Careful consideration must be given to die attachment because it strongly influences thermal management and stress isolation. The bond must not crack or suffer from creep over time. Die attachment processes typically employ metal alloys or organic or inorganic adhesives as intermediate bonding layers. Metal alloys typically include all forms of solder, including eutectic and non-eutectic solders. Organic adhesives include epoxies, silicones, and polyimides. The choice of a solder alloy depends on having suitable melting temperature and mechanical properties. Solder firmly attaches the die to the package and normally provides little or no stress isolation when compared to organic adhesives. However, the bond is very robust and can sustain a large, normal pull force. Metal solders are typically unsuitable if the package frame includes contact pads in the package frame reference surface positioned to electrically couple with the die. The large mismatch in coefficient of thermal expansion between the die and the package frame typically results in undesirable stress and can cause cracks in the bond.

Figure 6:
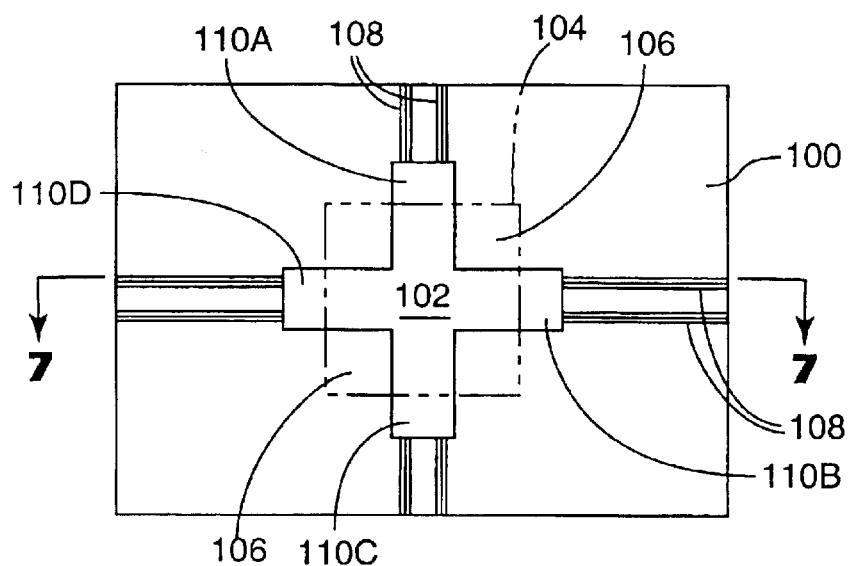
FIG. 6 is a top view of an alternate package frame in accordance with the present invention.

FIG. 6 is a top view of an alternate package frame 100 having an aperture 102 with a more complex shape. Die 104 is shown schematically to indicate the interface of the package frame reference surface 106 with the die 104. V-grooves 108 are directed to the aperture 102 from all four sides. Portions or arms 110A, 110B, 110C, 110D of the aperture 102 allow the optical fibers and corresponding lenses to terminate before the edge of the die 104 is reached (see FIGS. 7 and 8). As will be discussed below, the height of the lens on the optical fiber can be adjusted relative to the die reference surface to compensate for the height of the optical micro-mechanical devices by controlling the depth of the V-grooves 108.

Figure 7:
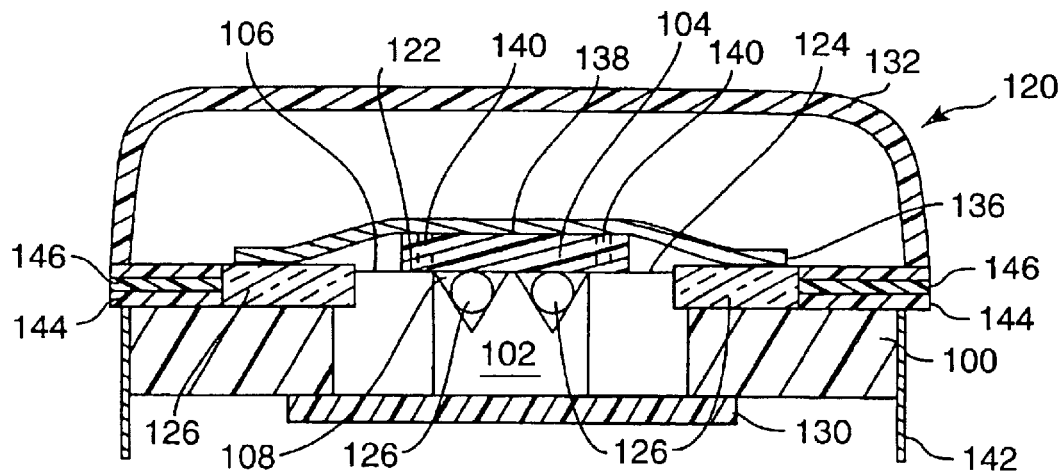
FIG. 7 is a side sectional view of a micro-mechanical device packaged in the package frame of FIG. 6.

FIG. 7 is a side sectional view of a packaged optical micro-mechanical device 120 with die mounting surface 122 bonded to package frame reference surface 106 along optical interface reference plane 124. V-grooves 108 have a depth such that lenses 126 and ferrules 144 containing optical fibers 146 extend both above and below the optical interface reference plane 124. The outside diameter of the ferrules 144 preferably match the outside diameter of the lenses 126 so that the V-groove can be one constant depth. The depth of the grooves 108 can be used to adjust the position of the lenses 126 relative to the optical interface reference plane 124. That is, the lenses 126 can be positioned relative to the optical interface reference plane 124 independent of the die reference surface 122. By changing the depth of the V-grooves 108, the package frame 100 of FIG. 6 can be used with a variety of dies 104 while still aligning the lenses 126 with the optical micro-mechanical devices (see FIG. 3). The embodiment of FIG. 7 can also be used with the contact pads 80, 82 of FIG. 4.

The package frame 100 preferably includes a bottom cover 130 extending over aperture 102. In the embodiment illustrated in FIG. 7, top cover 132 is a separate component bonded to the package frame 100 using a variety of techniques, such as solder, brazing, adhesives, etc. Electrical connections are made to the die 104 using flex circuit 136. In the embodiment illustrated in FIG. 7, the flex circuit 136 extends along back surface 138 of the die 104. Vias 140 formed in the die 104 electrically couple the flex circuit 136 with the optical micro-mechanical devices (see FIG. 3) on the die reference surface 122. A pin grid array 142 or a variety of other connectors can be used for coupling the flex circuit 136 to other electrical components. Any of the electrical interconnect techniques disclosed herein can be used with the embodiment of FIG. 7.

Figure 8:
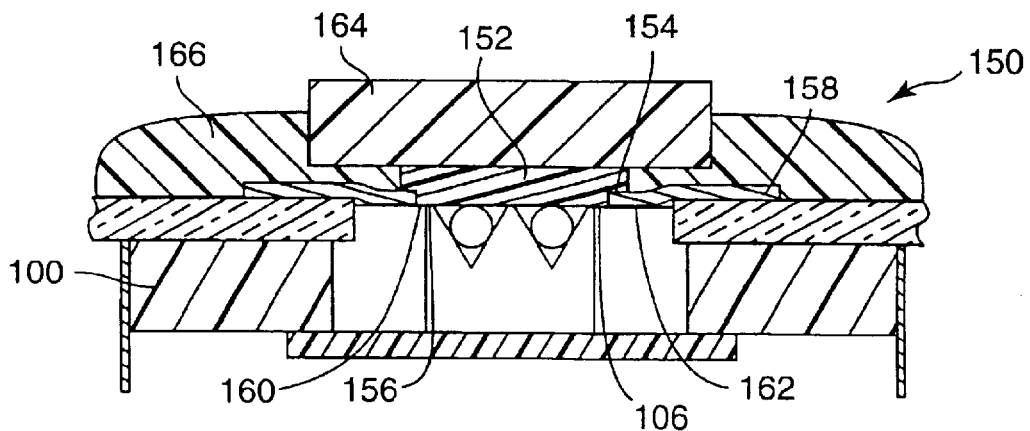
FIG. 8 is an alternate micro-mechanical device packaged in the package frame of FIG. 6.

FIG. 8 is a side sectional view of an alternate packaged optical micro-mechanical device 150 using the package frame 100 of FIG. 6. Die 152 is formed with a shoulder 154 around at least a portion of its perimeter. Electrical traces extend along front surface 156 of the die 152 to the shoulder 154. Flex circuit 158 electrically couples with the contact pads on the shoulder 154 of the die 152. Die reference surface 160 couples with package frame reference surface 106 to form an optical interface reference plane 162, as discussed above. Tooling fixture 164 and encapsulating material 166 are optionally provided with the packaged optical micro-mechanical device 150. The encapsulating material 166 can optionally be thermally conductive.

Figure 9:
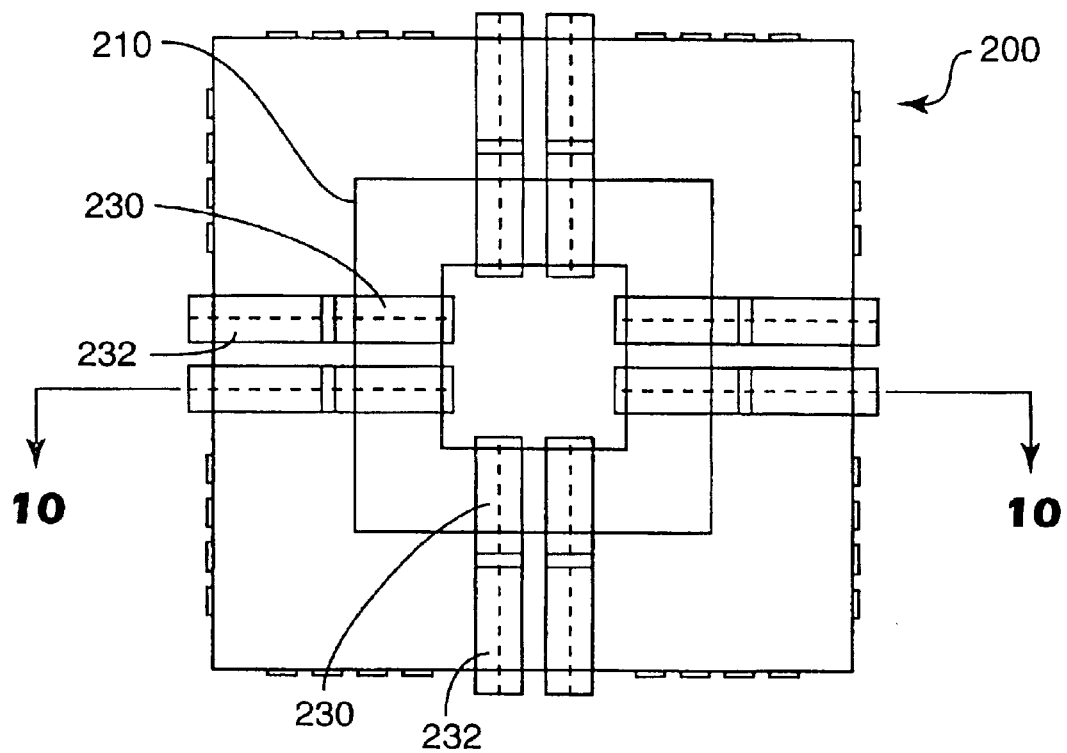
FIG. 9 is a top view of a packaged micro-mechanical device.
Figure 10:
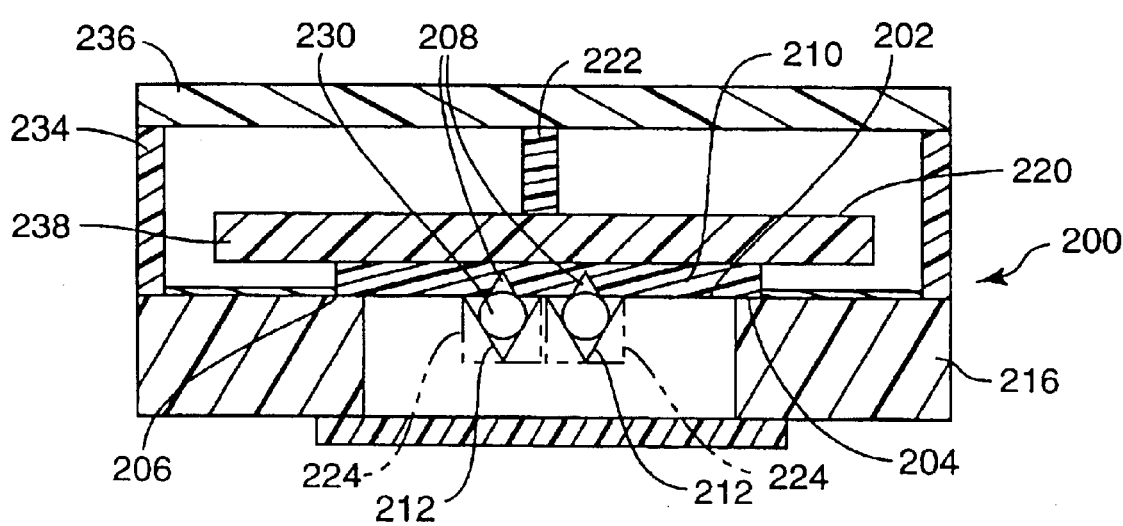
FIG. 10 is a sectional view of the packaged micro-mechanical device of FIG. 9.

FIGS. 9 and 10 are top and side sectional views of a packaged optical micro-mechanical device 200 in accordance with the present invention. Die reference surface 202 is bonded to package frame reference surface 204 (with or without the contact pads of FIG. 4) to form an optical interface reference plane 206. V-grooves 208 are formed in MEMS die 210 to vertically and horizontally center lenses 230 to the centerline of optical micro-mechanical devices 224. The V-grooves 208 in the die 210 can be machined or formed using the MUMPs process.

The package frame 216 contains V-grooves 212 that horizontally match to those on the die 210. Vertically, the V-grooves 208, 212 are designed to align the centerline of the lenses 230 to the centerline of the fiber ferrules 232. The depth of the grooves 208, 212 can be adjusted so that the location of lenses 230 relative to the optical interface reference plane 206 can be optimized for the particular optical micro-mechanical devices 224.

The outside diameter of the fiber ferrule 232 preferably matches the outside diameter of the lenses 230, so a single size V-groove 212 can be formed in the package frame 216. The combination of the two sets of V-grooves 208, 212 align the die 210 to the package frame 216 using the lenses 230 and/or ferrules 232 as the datum in all three orthogonal axes. Simultaneously, when the die reference surface 202 is engaged with the package frame reference surface 204, the lenses 230 are captured and automatically aligned with the optical micro-mechanical devices 224 on the die 210.

The embodiment of FIGS. 9 and 10 optionally includes a heat sink 220 with a tooling post 222. The heat sink 220 optionally includes extension tabs 238 that extend beyond the perimeter of the die 216. The extension tabs 238 can be any of a variety of shapes. Upper frame member 234 and cover 236 attach to the package frame 216 to protect the die 210. A thermally conductive encapsulating material may optionally be provided between the heat sink 220 and the cover 236.

Figure 11:
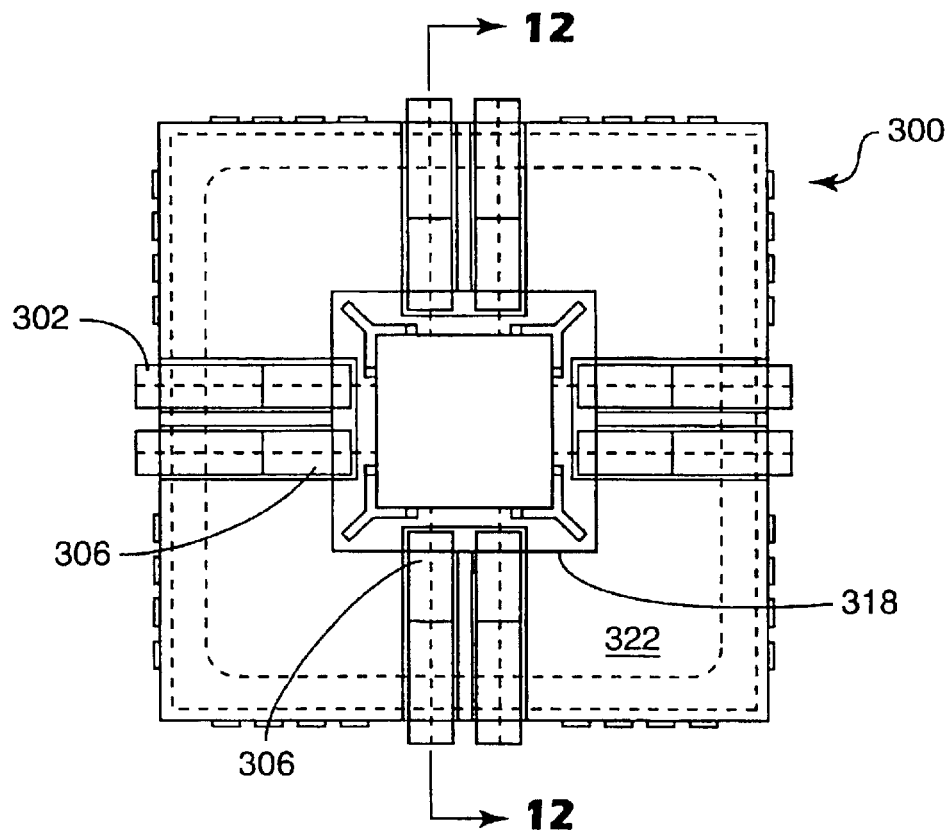
FIG. 11 is a top view of a packaged micro-mechanical device in accordance with the present invention.
Figure 12:
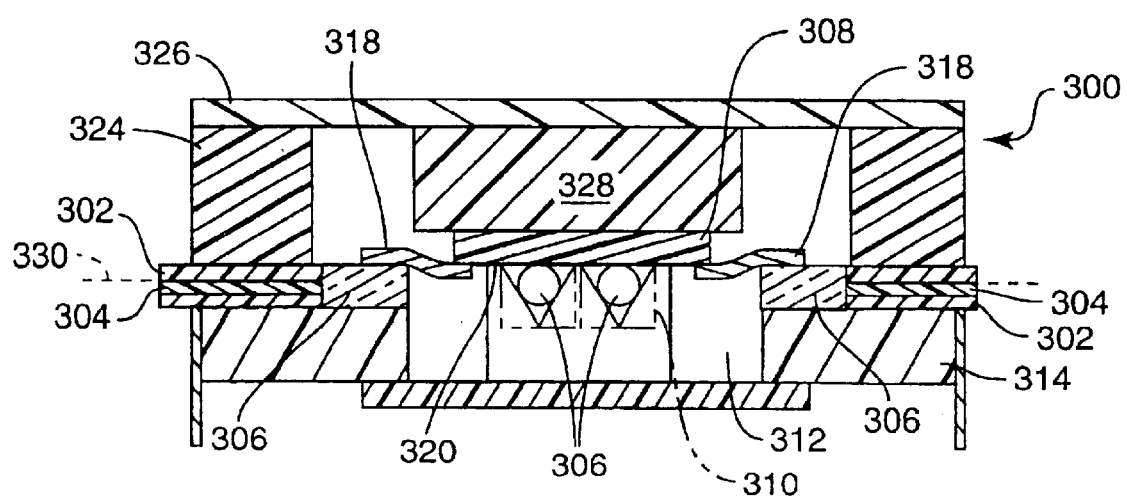
FIG. 12 is a side sectional view of the packaged micro-mechanical device of FIG. 11.
Figure 13:
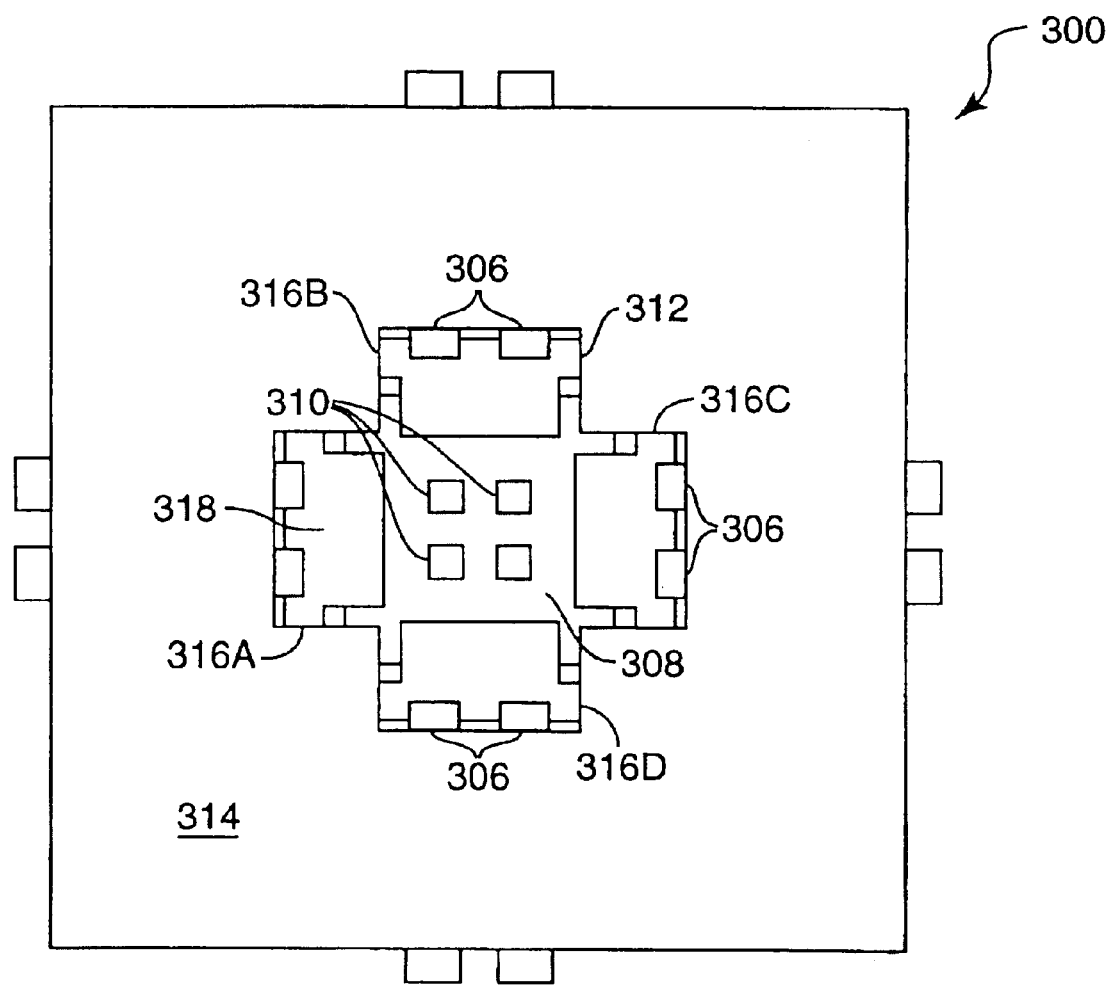
FIG. 13 is a bottom view of the packaged micro-mechanical device of FIG. 11.

FIGS. 11–13 illustrate an alternate packaged optical micro-mechanical device 300 in accordance with the present invention. A pair of ferrules 302 containing optical fibers 304 with corresponding lenses 306 are positioned on each side of the die 308. The lenses 306 terminate before the edge of the die 308. The eight lenses 306 and associated optical fibers 304 are for illustration purposes only and the number of fibers can vary depending on the application.

Optical micro-mechanical devices 310 are positioned in cross-shaped aperture 312 so that only the corners of the die 308 contact package frame 314 (see e.g., FIG. 6). Die reference surface 320 comprises the optical interface reference plane 330. The gaps created in the portions 316A, 316B, 316C, 316D of the aperture 312 permit a flexible circuit 318 to electrically couple with contact pads on the die reference surface 320 (see FIG. 13) and extend out along top surface 322 of the package frame 314 (see FIG. 11). For the sake of clarity, upper package frame 324, cover 326 and tooling fixture 328 are only shown in FIG. 12. The upper package frame 324 and cover 326 can be formed from a single piece of material or can be separate components. A thermally conductive elastomeric material is optionally provided between the tooling fixture 328 and the die 308 and/or the tooling fixture 328 and the cover 326.

All of the patents and patent applications disclosed herein, including those set forth in the Background of the Invention, are hereby incorporated by reference. Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention.

What is claimed is:

1. A package for optical micro-mechanical devices, comprising:

one or more optical micro-mechanical devices on a first surface of a die, the first surface of the die including a die reference surface;

a package frame comprising an aperture and a first surface, the first surface of the package frame comprising a package frame reference surface proximate the aperture, wherein the package frame reference surface is adapted to allow the die reference surface to be mounted to the package frame reference surface such that the optical micro-mechanical devices are located in the aperture;

one or more optical interconnect alignment mechanisms formed in the first surface of the package frame, terminating adjacent to the aperture and positioned relative to an optical interface reference plane; and distal ends of one or more optical interconnects located in the optical interconnect alignment mechanisms and optically coupled with one or more of the optical micro-mechanical devices, wherein the optical interconnects terminate adjacent to the die without contacting the die.

2. The apparatus of claim 1 wherein the optical interface reference plane comprises the die reference surface.

3. The apparatus of claim 1 wherein the optical interface reference plane comprises the package frame reference surface.

4. The apparatus of claim 1 wherein the optical interface reference plane comprises the plane parallel to the die reference surface located between the die reference surface and the package frame reference surface.

5. The apparatus of claim 1 wherein the optical interconnect alignment mechanisms comprise V-grooves located in the package frame reference surface.

6. The apparatus of claim 1 wherein the optical interconnect alignment mechanisms comprise V-grooves located in the die reference surface.

7. The apparatus of claim 1 wherein the optical interconnect alignment mechanisms are located in both the package frame reference surface and the die reference surface.

8. The apparatus of claim 1 wherein the optical interconnects comprise a tangential relationship with the optical interface reference plane.

9. The apparatus of claim 1 wherein a first portion of an optical interconnect is positioned on one side of the optical interface reference plane and a second portion of the optical interconnect is positioned on another side of the optical interface reference plane.

10. The apparatus of claim 1 wherein at least one of the optical interconnects contacts the die.

11. The apparatus of claim 1 wherein the optical interconnect comprises an optical fiber and a lens.

12. The apparatus of claim 11 wherein the lens optically couples the optical fiber with one or more optical micro-mechanical devices.

13. The apparatus of claim 11 wherein the lens contacts the die.

14. The apparatus at claim 11 wherein the lens terminates adjacent to the die without contacting the die.

15. The apparatus of claim 1 comprising one or more contact pads interposed between the die reference surface and the package frame reference surface.

16. The apparatus of claim 15 comprising a contact pad on the die reference surface and a contact pad on the package frame reference surface.

17. The apparatus of claim 15 wherein the contact pad electrically couples one or more optical micro-mechanical devices with external electrical contacts.

18. The apparatus of claim 15 wherein the contact pad electrically couples one or more optical micro-mechanical devices with a flexible circuit member.

19. The apparatus of claim 15 wherein the contact pad electrically couples one or more optical micro-mechanical devices with contact pads located on the package frame reference surface.

20. The apparatus of claim 1 wherein the aperture comprises a rectangular shape.

21. The apparatus of claim 1 wherein the aperture comprises a complex shape.

22. The apparatus of claim 1 wherein the aperture comprises a cross-shape configured so that the distal ends of the optical fibers terminate in arms of the cross-shaped aperture without contacting the die.

23. The apparatus of claim 1 comprising a tooling fixture on a rear surface of the die.

24. The apparatus of claim 23 wherein the tooling fixture comprises a tooling post.

25. The apparatus of claim 23 wherein the tooling fixture comprises a heat sink.

26. The apparatus of claim 1 comprising an encapsulating material sealing the die to the package frame.

27. The apparatus of claim 1 comprising a cover sealing the die to the package frame.

28. The apparatus of claim 1 wherein the aperture comprises a cover.

29. The apparatus of claim 1 comprising a flexible circuit electrically coupled to the die.

30. The apparatus of claim 1 comprising electric traces on the package frame, the electric traces electrically coupled to contact pads in the package frame reference surface.

31. The apparatus of claim 1 comprising:
   a flexible circuit extending across a rear surface of the die;
   one or more vias extending through the die and electrically coupling the optical micro-mechanical devices to the flexible circuit.

32. The apparatus of claim 1 comprising:
   a shoulder region adjacent to the optical micro-mechanical devices;
   electrical traces extending from the optical micro-mechanical devices to the shoulder region; and
   a flexible circuit located between the shoulder region and the optical interface reference plane, the flexible circuit being electrically coupled to the traces.

33. The apparatus of claim 1 wherein the package frame comprises:
   one or more alignment posts positioned to engage with the die reference surface; and
   a cavity adjacent to the alignment posts on a side opposite the aperture.

34. The apparatus of claim 33 comprising a flexible circuit extending through the cavity electrically coupled with contact pads on the die reference surface.

35. The apparatus of claim 33 comprising an adhesive located in the cavity sufficient to retain the die to the alignment posts.

36. The apparatus of claim 1 comprising an optical communication system including at least one packaged optical micro-mechanical device.

* * * * *

UNITED STATES PATENT AND TRADEMARK OFFICE
CERTIFICATE OF CORRECTION

PATENT NO.    : 6,798,954 B2
DATED         : September 28, 2004
INVENTOR(S)   : Carpenter, Barry S.

It is certified that error appears in the above-identified patent and that said Letters Patent is hereby corrected as shown below:

Column 4,
Line 2, delete "electromechanical" and insert in place thereof -- electro-mechanical --.

Column 11,
Line 10, delete "at" and insert in place thereof -- of --.

Signed and Sealed this

Tenth Day of May, 2005

JON W. DUDAS
*Director of the United States Patent and Trademark Office*